US007674687B2

(12) United States Patent
Henley (10) Patent No.: US 7,674,687 B2
(45) Date of Patent: *Mar. 9, 2010

(54) METHOD AND STRUCTURE FOR FABRICATING MULTIPLE TILED REGIONS ONTO A PLATE USING A CONTROLLED CLEAVING PROCESS (75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/191,464

(22) Filed: Jul. 27, 2005

(65) Prior Publication Data
US 2007/0026638 A1 Feb. 1, 2007

(51) Int. Cl.
H01L 21/30 (2006.01)
(52) U.S. Cl. ............... 438/459; 438/455; 257/E21.568
(58) Field of Classification Search ............. 438/459, 438/455; 257/E21.568
See application file for complete search history.

(56) References Cited

U.S. PATENT DOCUMENTS

| 2,981,877 | A |   | 4/1961  | Noyce         |         |
|-----------|---|---|---------|---------------|---------|
| 4,363,828 | A |   | 12/1982 | Brodsky et al.|         |
| 4,585,671 | A |   | 4/1986  | Kitagawa et al.|        |
| 4,696,758 | A |   | 9/1987  | Ovshinsky et al.|       |
| 5,120,394 | A |   | 6/1992  | Mukai         |         |
| 5,494,835 | A | * | 2/1996  | Bruel         | 156/250 |
| 5,789,030 | A |   | 8/1998  | Rolfson       |         |
| 5,863,830 | A | * | 1/1999  | Bruel et al.  | 438/478 |
| 5,877,070 | A |   | 3/1999  | Goesele et al.|         |
| 6,013,563 | A |   | 1/2000  | Henley et al. |         |
| 6,020,252 | A | * | 2/2000  | Aspar et al.  | 438/458 |
| 6,033,974 | A |   | 3/2000  | Henley et al. |         |
| 6,048,411 | A | * | 4/2000  | Henley et al. | 148/33.5|
| 6,100,166 | A |   | 8/2000  | Sakaguchi et al.|       |
| 6,103,599 | A |   | 8/2000  | Henley et al. |         |
| 6,171,965 | B1|   | 1/2001  | Kang et al.   |         |
| 6,180,496 | B1|   | 1/2001  | Farrens et al.|         |
| 6,225,192 | B1| * | 5/2001  | Aspar et al.  | 438/460 |
| 6,287,941 | B1|   | 9/2001  | Kang et al.   |         |

(Continued)

FOREIGN PATENT DOCUMENTS

WO    WO 99/08316    2/1999

OTHER PUBLICATIONS

Bruel et al., ".RTM. Smart Cut: A Promising New SOI Material Technology," IEEE International SOI Conference, Oct. 1995, pp. 178-179.*

(Continued)

Primary Examiner—Jarrett J Stark
(74) Attorney, Agent, or Firm—Townsend and Townsend and Crew LLP (57) ABSTRACT A reusable transfer substrate member for forming a tiled substrate structure. The member including a transfer substrate, which has a surface region. The surface region comprises a plurality of donor substrate regions. Each of the donor substrate regions is characterized by a donor substrate thickness and a donor substrate surface region. Each of the donor substrate regions is spatially disposed overlying the surface region of the transfer substrate. Each of the donor substrate regions has the donor substrate thickness without a definable cleave region.

18 Claims, 7 Drawing Sheets

U.S. PATENT DOCUMENTS

| | | | |
|---|---|---|---|
| 6,335,258 B1* | 1/2002 | Aspar et al. | 438/406 |
| 6,368,930 B1 | 4/2002 | Enquist | |
| 6,455,399 B2 | 9/2002 | Malik et al. | |
| 6,500,694 B1 | 12/2002 | Enquist | |
| 6,534,381 B2 | 3/2003 | Cheung et al. | |
| 6,563,133 B1 | 5/2003 | Tong | |
| 6,580,128 B2* | 6/2003 | Ohkubo | 257/347 |
| 6,586,785 B2 | 7/2003 | Flagan | |
| 6,627,531 B2 | 9/2003 | Enquist | |
| 6,653,212 B1 | 11/2003 | Yamanaka et al. | |
| 6,699,531 B1 | 3/2004 | Fukiage | |
| 6,716,751 B2 | 4/2004 | Todd | |
| 6,723,606 B2 | 4/2004 | Flagan | |
| 6,740,909 B2 | 5/2004 | Enquist | |
| 6,756,281 B2 | 6/2004 | Enquist | |
| 6,771,410 B1 | 8/2004 | Bourianoff | |
| 6,804,062 B2 | 10/2004 | Atwater | |
| 6,818,529 B2 | 11/2004 | Bachrach et al. | |
| 6,821,825 B2 | 11/2004 | Todd et al. | |
| 6,822,326 B2 | 11/2004 | Enquist et al. | |
| 6,846,723 B2* | 1/2005 | Ohkubo | 438/455 |
| 6,858,107 B2 | 2/2005 | Ghyselen et al. | |
| 6,858,517 B2 | 2/2005 | Martinez et al. | |
| 6,864,585 B2 | 3/2005 | Enquist | |
| 6,867,073 B1 | 3/2005 | Enquist | |
| 6,875,671 B2 | 4/2005 | Faris | |
| 6,884,696 B2 | 4/2005 | Aga et al. | |
| 6,900,115 B2 | 5/2005 | Todd | |
| 6,902,987 B1 | 6/2005 | Tong et al. | |
| 6,905,557 B2 | 6/2005 | Enquist | |
| 6,962,858 B2 | 11/2005 | Neyret et al. | |
| 6,962,859 B2 | 11/2005 | Todd et al. | |
| 7,019,339 B2 | 3/2006 | Atwater | |
| 7,029,995 B2 | 4/2006 | Todd et al. | |
| 7,160,790 B2* | 1/2007 | Henley et al. | 438/455 |
| 2001/0007367 A1* | 7/2001 | Ohkubo | 257/347 |
| 2002/0168868 A1 | 11/2002 | Todd | |
| 2002/0173113 A1 | 11/2002 | Todd | |
| 2002/0190269 A1 | 12/2002 | Atwater | |
| 2002/0197831 A1 | 12/2002 | Todd et al. | |
| 2003/0020062 A1* | 1/2003 | Faris | 257/40 |
| 2003/0082300 A1 | 5/2003 | Todd et al. | |
| 2003/0095340 A1 | 5/2003 | Atwater | |
| 2003/0111013 A1 | 6/2003 | Oosterlaken et al. | |
| 2003/0129545 A1 | 7/2003 | Kik | |
| 2003/0175531 A1* | 9/2003 | Fournel et al. | 428/441 |
| 2003/0230629 A1 | 12/2003 | Bourianoff | |
| 2003/0230778 A1 | 12/2003 | Park et al. | |
| 2004/0007739 A1* | 1/2004 | Ohkubo | 257/347 |
| 2004/0056332 A1* | 3/2004 | Bachrach et al. | 257/640 |
| 2004/0214434 A1 | 10/2004 | Atwater | |
| 2004/0253794 A1* | 12/2004 | Faris | 438/459 |
| 2005/0026400 A1 | 2/2005 | Todd et al. | |
| 2005/0026432 A1 | 2/2005 | Atwater | |
| 2005/0085049 A1 | 4/2005 | Atwater | |
| 2005/0092235 A1 | 5/2005 | Brabant et al. | |
| 2005/0142879 A1 | 6/2005 | Atwater | |
| 2005/0153524 A1 | 7/2005 | Maa et al. | |
| 2005/0208740 A1 | 9/2005 | Todd | |
| 2005/0221583 A1* | 10/2005 | Aspar et al. | 438/458 |
| 2005/0245049 A1 | 11/2005 | Akatsu et al. | |
| 2005/0247924 A1 | 11/2005 | Atwater | |
| 2005/0250302 A1 | 11/2005 | Todd et al. | |
| 2005/0272222 A1 | 12/2005 | Flamand et al. | |
| 2005/0275067 A1 | 12/2005 | Atwater | |
| 2006/0019464 A1 | 1/2006 | Maa et al. | |
| 2006/0021565 A1 | 2/2006 | Zahler | |
| 2006/0024435 A1 | 2/2006 | Holunga | |
| 2006/0030124 A1 | 2/2006 | Maa et al. | |
| 2006/0030131 A1 | 2/2006 | Richardson | |
| 2006/0060943 A1 | 3/2006 | Mohamed et al. | |
| 2006/0071213 A1 | 4/2006 | Ma et al. | |
| 2006/0088985 A1 | 4/2006 | Haverkort et al. | |
| 2006/0108688 A1 | 5/2006 | Richardson | |
| 2006/0112986 A1 | 6/2006 | Atwater | |
| 2008/0038908 A1* | 2/2008 | Henley | 438/530 |

OTHER PUBLICATIONS

Agarwal, et. al., Efficient Production of Silicon-on-Insulator Films by Co-Implantation of the He+ with H+, Applied Physics, Mar. 2, 1998, Letters, vol. 72, No. 9.

Bennett et al., Complete Surface Exfoliation of 4H-SiC by H+—and Si+ Coimplantation, Applied Physics Letters, vol. 76, No. 22, May 29, 2000.

Brendel, A Novel Process for Ultrathin Monocrystalline Silicon Solar Cells on Glass, 14$^{th}$ European Photovoltaic Solar Energy Conference, Jun. 30 to Jul. 4, 1997, Barcelona, Spain.

Brendel, Crystalline Thin-Film Silicon Solar Cells from Layer-Transfer Processes: A Review, Proc. 10$^{th}$ Workshop on Crystalline Silicon Solar Cell Materials and Processes, Aug. 13-16, 2000, Copper Mountain, USA, ed. by B.L. Sopori, (NREL, Golden, 2000).

Deboer, Low Temperature Epitaxial Silicon Growth Using Electron Cyclotron Resonance Plasma Deposition, Dissertation, Iowa State University, Ames, IA 1995.

Deboer et al., Preparation and Properties of High Quality Crystalline Silicon Films Grown by ECR Plasma Deposition, IEEE, Hawaii, Dec. 5-9, 1994.

De Moor, Technology Development for 3D Integration at IMEC "3D Architectures for Semiconductor Integration and Packaging", Tempe AZ Jun. 13-15, 2005.

Deng et. al., High Efficiency and High Rate Deposited Amorphous Silicon-Based Solar Cells, Phase II, Annual Technical Progress Report, Sep. 1, 2002 to Aug. 31, 2003 NREL Subcontract No. NDY-2-30630-08.

Du et. al., Impact of Hydrogen dilution on Microstructure and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr., et. al., Chemical Vapor Deposition of Boron-Doped Hydrogenated Amorphous Silicon, App. Phys. Lett, 47 (2), Jul. 15, 1985, p. 135.

Feijoo et al., Prestressing of Bonded Wafers. Proceedings of the First International Symposium on Semiconductor Wafer Bonding: Science, Technology and Applications, The Electrochemical Society, vol. 92-7, New York, NY 1992.

Garrou, 3D Integration: A Status Report "3D Architectures for Semiconductor Integration and Packaging", Tempe AZ Jun. 13-15, 2005.

Gösele, Semiconductor Wafer Bonding: Science Technology and Applications, Electrochemical Society Proceedings, vol. 97-36, pp. 229-248.

Gui et al., The Effect of Surface Roughness on Direct Wafer Bonding, Journal of Applied Physics vol. 85, No. 10, May 15, 1999.

Gui et al., Selective Wafer Bonding by Surface Roughness Control, Journal of the Electrochemical Society, 148 (4), G225-228, 2001.

Henttinen et al., Cold Ion-Cutting of Hydrogen Implanted Si, Nuclear Instruments and Methods in Physics Research B, 190, 761-766, 2002.

Huff et. al. Silicon Materials Science and Technology, Electrochemical Society Proceedings vol.98-1, pp. 1385-1394.

Hurley et al., Ion Implantation of Hydrogen and Helium into Silicon Wafers for Layer Transfer in Devices, Vacuum, 78, 167-175, 2005.

Joly, New Wafer to Wafer and Chip to Wafer Device Stacking Technology Implementations "3D Architectures for Semiconductor Integration and Packaging", Tempe AZ Jun. 13-15, 2005.

Kumata et. al., Photochemical Vapor Deposition of Hydrogenated Amorphous Silicon Films from Disilance and Trisilane using a Low Pressure Mercury Lamp, Appl. Phys. Lett 48 (20) May 19, 1986, p. 1380.

Lee et al., Strained Silicon Thin-Film Transistors Fabricated on Glass, Applied Physics Letters, 86, 103504, Feb. 2005.

Morrison et. al., Deposition of Amorphous and Micro-Crystalline Silicon using a Graphite Filament in the Hot Wire CVD Technique, J. Vac. Sci. Technol A19 (6), Nov./Dec. 2001, p. 2817.

Reber et. al., Progress in High-Temperature Silicon Epitaxy using the RTCVD160 Processor, presented at the 19$^{th}$ European Solar Energy Conference, Jun. 7-11, 2004, Paris.

Roth et. al., Kinetics of Solid Phase Epitaxy in Thick Amorphous Si Layers formed by MeV Ion Implantation, Appl. Phys. Lett 57 (13) Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Fancisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Venezia et al., The Role of Implantation Damage in the Production of Silicon-On-Insulator Films by Co-Implantation of He+ and H+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et. al, 17.8% P Type Heterojunction Silicon Solar Cells by HWCVD, National Renewable Energy Laboratory, Colorado, PowerPoint Presentation, Spring 2006.

Weldon et al., On The Mechanism of The Hydrogen-Induced Exfoliation of Silicon, J. Vac. Science Tech. B, 15(4), Jul./Aug. 1997.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/Helium co-Implantation, Applied Physics Letter, vol. 73, No. 25, Dec. 21, 1998.

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

* cited by examiner

METHOD AND STRUCTURE FOR FABRICATING MULTIPLE TILED REGIONS ONTO A PLATE USING A CONTROLLED CLEAVING PROCESS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to the manufacture of substrates. More particularly, the invention provides a technique including a method and a structure for forming multi-layered substrate structures, using a tiled approach, for the fabrication of devices, for example, on flat panel displays. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), nano-technology structures, sensors, actuators, solar cells, biological and biomedical devices, and the like.

From the very early days, human beings have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, a flat panel display, and others. These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and or brittle materials, such as diamond or glass. Additionally, the saw operation has difficulty in manufacturing larger substrates for flat panel displays and the like.

Accordingly, techniques have been developed to fabricate flat panel display substrates. These substrates are often fabricated on large sheets of glass or other like structures. The sheets of glass are subjected to thin film processing at lower temperatures. Amorphous silicon is often used to form thin film transistor devices on these sheets of glass. Amorphous silicon, however, suffers from a variety of known limitations.

As an example, amorphous silicon often has higher resistance than conventional single crystal silicon. Additionally, amorphous silicon may be difficult to use for high speed device applications due to its low relative carrier mobility. Accordingly, certain techniques have been developed to cleave a thin film of crystalline material from a larger donor substrate portion. These techniques are commonly known as "layer transfer" processes. Such layer transfer processes have been useful in the manufacture of specialized substrate structures, such as silicon on insulator or display substrates. As merely an example, a pioneering technique was developed by Francois J. Henley and Nathan Chung to cleave films of materials. Such technique has been described in U.S. Pat. No. 6,013,563 titled Controlled Cleaving Process, assigned to Silicon Genesis Corporation of San Jose, Calif., and hereby incorporated by reference for all purposes. Although such technique has been successful, there is still a desire for improved ways of manufacturing multilayered structures.

From the above, it is seen that a technique for manufacturing large substrates which is cost effective and efficient is desirable.

BRIEF SUMMARY OF THE INVENTION

According to the present invention, techniques related to the manufacture of substrates are provided. More particularly, the invention provides a technique including a method and a structure for forming multi-layered substrate structures, using a tiled approach, for the fabrication of devices, for example, on flat panel displays. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), nano-technology structures, sensors, actuators, solar cells, biological and biomedical devices, and the like.

In a specific embodiment, the present invention provides a method for forming a plurality of tile structures on a substrate member. The method includes providing a transfer substrate, e.g., glass, semiconductor substrate, quartz, a composite, or other suitable material. In a preferred embodiment, the transfer substrate has a surface region, which has a plurality of donor substrate regions, e.g., silicon, germanium, gallium arsenide, gallium nitride, silicon carbide, other Group III/V materials, Group II/VI materials, any combination of these, and others. Each of the donor substrate regions is characterized by a donor substrate thickness and a donor substrate surface region. Each of the donor substrate regions is spatially disposed overlying the surface region of the transfer substrate. Again in a preferred embodiment, the method implants a plurality of particles concurrently through each of the donor substrate surface regions to form a cleave region provided by the plurality of particles between a portion of the donor substrate thickness and the donor substrate surface region. The method also includes joining each of the donor substrate surface regions to a handle substrate surface region. The handle substrate surface region is provided from a handle substrate. The method includes removing the transfer substrate from the handle substrate to form a plurality of donor substrate portions spatially disposed overlying the handle substrate surface region.

In an alternative specific embodiment, the present invention provides a reusable transfer substrate member for forming a tiled substrate structure. The member including a transfer substrate, which has a surface region. The surface region comprises a plurality of donor substrate regions. Each of the donor substrate regions is characterized by a donor substrate thickness and a donor substrate surface region. Each of the donor substrate regions is spatially disposed overlying the surface region of the transfer substrate. Each of the donor substrate regions has the donor substrate thickness without a definable cleave region. That is, the donor substrate thickness exists but cannot be cleaved according to a specific embodiment.

In an alternative specific embodiment, the present invention provides a method for forming a plurality of tile structures on a substrate member, e.g., glass, quartz. The method includes providing a transfer substrate, which has a surface region. The surface region comprises a plurality of donor substrate regions. Each of the donor substrate regions is characterized by a donor substrate thickness and a donor substrate surface region. Each of the donor substrate regions is spatially disposed overlying the surface region of the transfer substrate. The method includes processing the donor substrate regions provided on the transfer substrate concurrently to form a cleave region between a portion of the donor substrate thickness and the donor substrate surface region for each of the donor substrates. Depending upon the embodiment, the processing can be a thermal process, implanting process, etching process, chemical and/or electro-chemical process, any combination of these, and others, which cause a change to a predetermined portion of the donor substrate thickness to form the cleave region, which becomes cleavable from non-cleavable. The method joins each of the donor substrate surface regions to a handle substrate surface region, which is from a handle substrate. The method also includes removing the transfer substrate from the handle substrate to form a plurality of donor substrate portions spatially disposed overlying the handle substrate surface region.

Numerous benefits are achieved over pre-existing techniques using the present invention. In particular, the present invention uses controlled energy and selected conditions to preferentially cleave a plurality of thin films of material from a plurality of donor substrates, which includes multi-material sandwiched films. This cleaving process selectively removes the plurality of thin films of material from the substrates while preventing a possibility of damage to the film or a remaining portion of the substrate. Additionally, the present method and structures allows for more efficient processing using implantation of a plurality of donor substrates simultaneously according to a specific embodiment. Furthermore, the invention provides a method and structure to form large master donor substrates including a plurality of donor substrate regions using an economical approach and fewer implanting steps, as compared to conventional techniques. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

According to the present invention, techniques related to the manufacture of substrates are provided. More particularly, the invention provides a technique including a method and a structure for forming multi-layered substrate structures, using a tiled approach, for the fabrication of devices, for example, on flat panel displays. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), nano-technology structures, sensors, actuators, solar cells, biological and biomedical devices, and the like.

Figure 1:
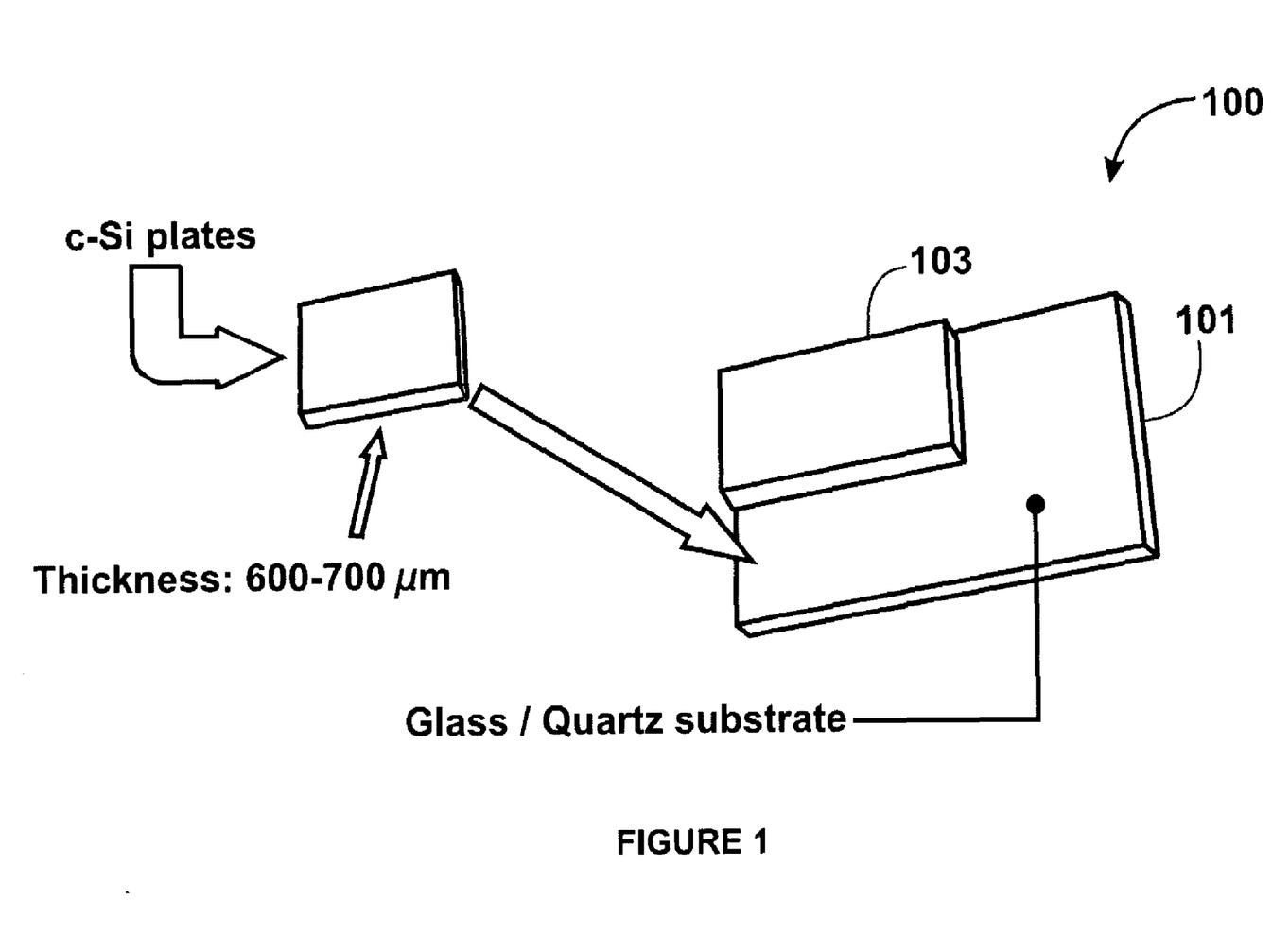
FIG. 1 is a simplified diagram illustrating a tiled substrate member according to an embodiment of the present invention.

FIG. 1 is a simplified diagram illustrating a master tiled substrate member 100 according to an embodiment of the present invention. This diagram is merely an illustration that should not unduly limit the scope of the claims herein. One of ordinary skill in the art would recognize other variations, modifications, and alternatives. As shown, the master tiled substrate member has a plurality of substrates regions 103 disposed spatially on a larger substrate member 101. The plurality of substrate regions can be used as a starting material for a plurality of donor substrate regions. The plurality of donor substrate regions can be made of a variety of materials such as silicon, germanium, gallium arsenide, gallium nitride, silicon carbide, other Group III/V materials, Group II/VI materials. The larger substrate member can be any suitable piece to act as a transfer substrate, which will be described in further detail below. The larger substrate is made of a suitable material that is rigid and can hold each of the donor substrate regions in place. Depending upon the embodiment, the substrate regions can be made of a single material, multiple materials, or any combination of these, and the like. Of course, there can be other variations, modifications, and alternatives.

Figure 2:
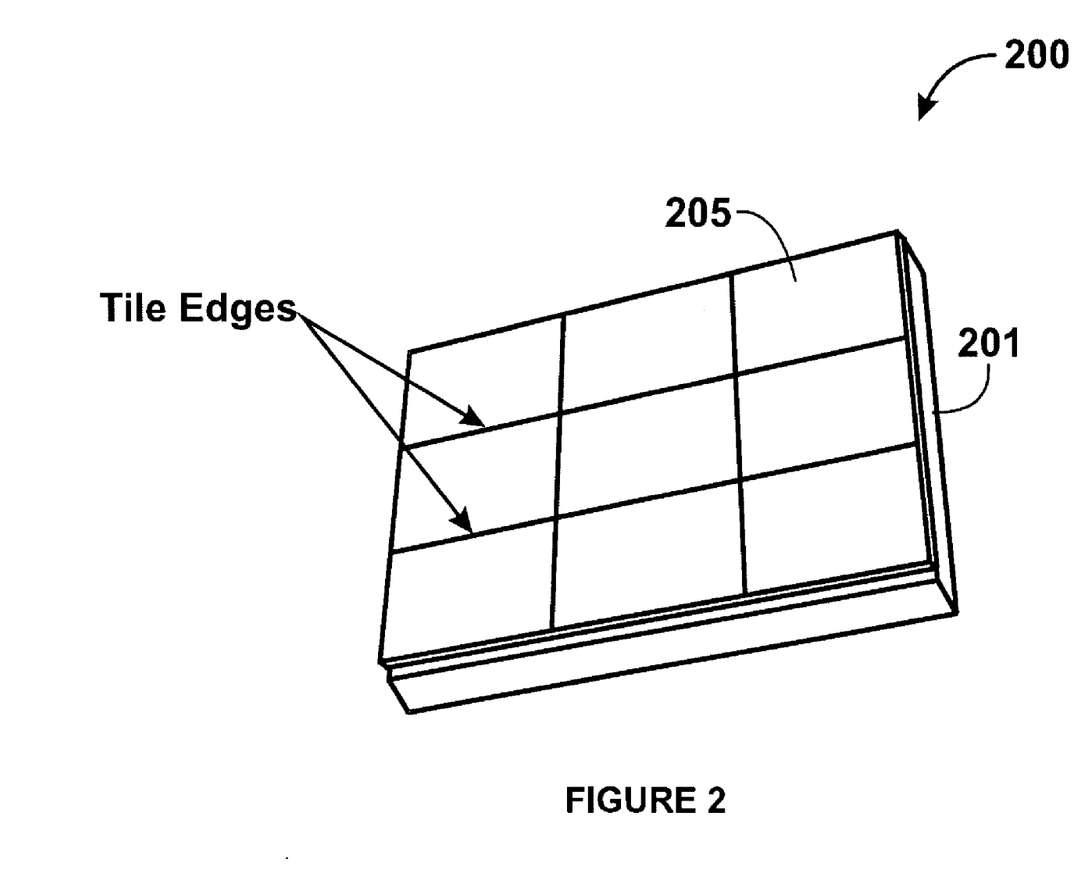
FIG. 2 is a simplified diagram illustrating an alternative tiled substrate member according to an alternative embodiment of the present invention.

FIG. 2 is a simplified diagram illustrating an alternative tiled substrate member including a handle substrate 200 according to an alternative embodiment of the present invention. This diagram is merely an illustration that should not unduly limit the scope of the claims herein. One of ordinary skill in the art would recognize other variations, modifications, and alternatives. As shown, the tiled substrates 205 are provided on handle substrate 201. Each of the tiled substrates is derived from a layer transfer process from the master tiled substrate, which was described above, and throughout the present specification. The layer transfer process may be a controlled cleaving process from Silicon Genesis Corporation of San Jose, Calif., a process called Eltran™ from Canon, Inc., of Japan and other processes, such as thermal treatment processes called SmartCut™ from Soitec, SA of France. Of course, there can be other variations, modifications, and alternatives. Details of methods according to embodiments of the present invention are provided throughout the present specification and more particularly below.

A method for fabricating a large area substrate using a tiled approach according to an embodiment of the present invention may be outlined as follows:

1. Provide a transfer substrate, the transfer substrate having a surface region;

2. Spatially disposing a plurality of donor substrate regions on the surface region of the transfer substrate, each of the donor substrate regions may be characterized by a donor substrate thickness and a donor substrate surface region;

3. Implant a plurality of particles concurrently through each of the donor substrate surface regions to form a cleave region provided by the plurality of particles between the donor substrate thickness and the donor substrate surface region;

4. Join each of the donor substrate surface regions to a handle substrate surface region, the handle substrate surface region being provided from a handle substrate; and 5. Initiate a controlled cleaving action within one or more of the donor substrates;

6. Remove the transfer substrate from the handle substrate to form a plurality of donor substrate portions spatially disposed overlying the handle substrate surface region;

7. Form one or more devices on one or more portions of the donor substrate portions spatially disposed overlying the handle substrate surface region; and 8. Perform other steps, as desired.

The above sequence of steps provides a method according to an embodiment of the present invention. As shown, the method uses a combination of steps including a way of forming a large substrate material using a plurality of donor substrates that are manufactured concurrently during a portion of their processing. Other alternatives can also be provided where steps are added, one or more steps are removed, or one or more steps are provided in a different sequence without departing from the scope of the claims herein. Further details of the present method can be found throughout the present specification and more particularly below.

The above sequence of steps provides a method according to an embodiment of the present invention. As shown, the method uses a combination of steps including a way of forming a large substrate material using a plurality of donor substrates that are manufactured concurrently during a portion of their processing. Other alternatives can also be provided where steps are added, one or more steps are removed, or one or more steps are provided in a different sequence without departing from the scope of the claims herein. Further details of the present method can be found throughout the present specification and more particularly below.

FIGS. 3 through 7 illustrate a simplified method for manufacturing a tiled substrate according to embodiments of the present invention. These diagrams are merely illustrations that should not unduly limit the scope of the claims herein. One of ordinary skill in the art would recognize other variations, modifications, and alternatives. As shown, the method begins by providing a transfer substrate 303, which has a surface region 303. The transfer substrate can be made of any suitable material such as a conductor, insulator, or semiconductor, which may be a composite, single layer, or multiple layers, or any combination of these, and the like. The conductor can be a metal such as aluminum, stainless steel, or other metal materials. The insulator can be a glass, a plastic, a quartz, or a ceramic, or combination of these, and the like. The semiconductor can be silicon, germanium, gallium arsenide, silicon-germanium alloy, any Group III/V materials, and others. The transfer substrate can be made of a single homogenous material, or a combination of various layers, depending upon the specific embodiment. Of course, there can be other variations, modifications, and alternatives.

Figure 3:
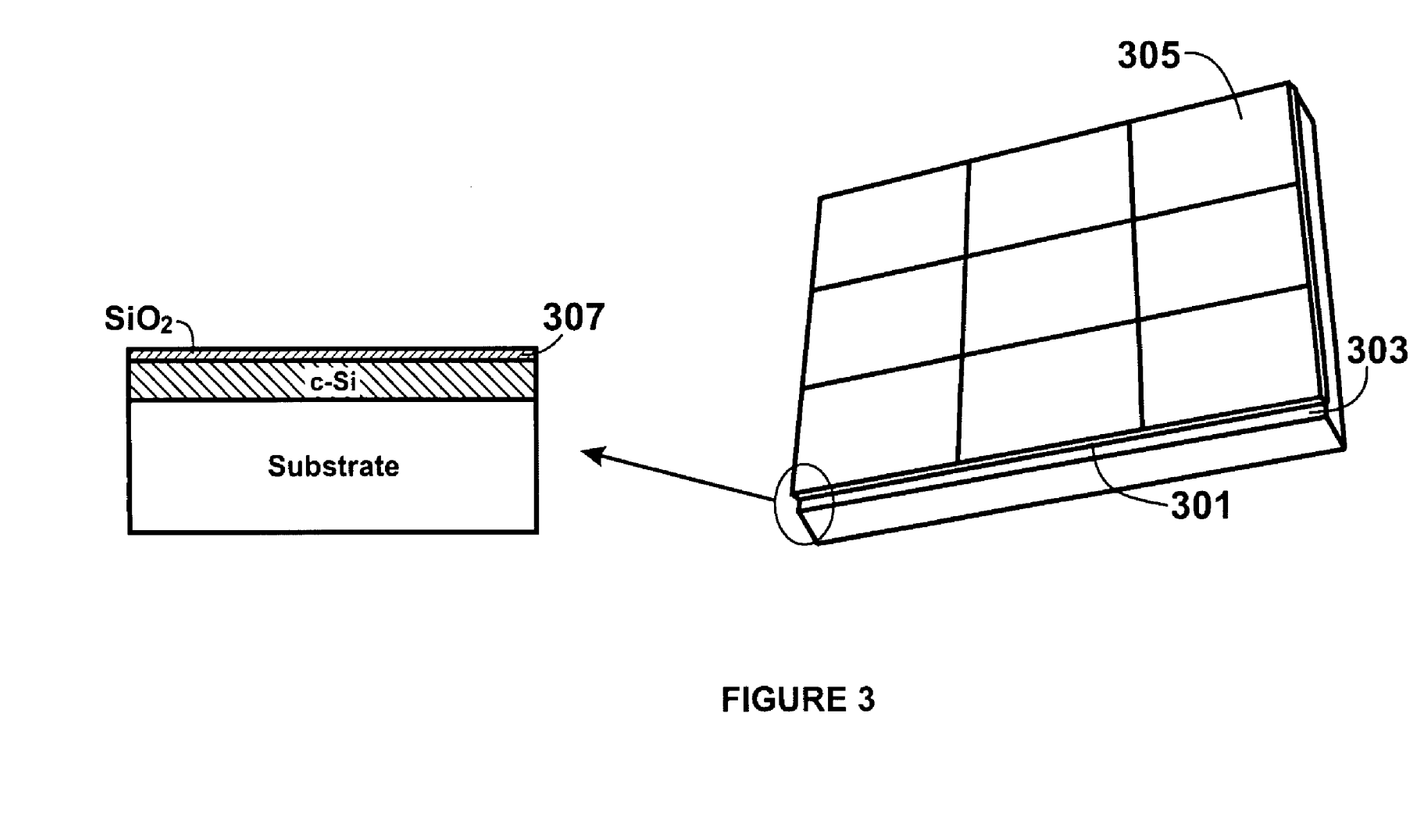
FIGS. 3 through 7 illustrate a simplified method for manufacturing a tiled substrate according to embodiments of the present invention

As shown, the transfer substrate has a plurality of donor substrate regions 305 on the surface region of the transfer substrate according to a specific embodiment. Each of the donor substrate regions may be characterized by a donor substrate thickness and a donor substrate surface region. The plurality of donor substrate regions can be made of a variety of materials such as silicon, germanium, gallium arsenide, gallium nitride, silicon carbide, other Group III/V materials, Group II/VI materials. Each of the donor substrate regions is smaller in size then the transfer substrate, which often has at least two times, three times, four times or greater a surface region of any individual donor substrate region. For example, a Generation 3.5 glass size (which is an industrial standard for the flat panel display industry) suitable for flat panel manufacturing is 620 mm×750 mm and is roughly 7.5 times larger in area than a 300 mm single crystal silicon substrate. Alternatively, the handle substrate may be much larger than Generation 3.5. The area ratio would also be proportionally larger if the round 300 mm substrate would be cut to tile the transfer substrate according to a specific embodiment.

In a preferred embodiment, each of the donor substrate regions is temporarily (or permanently) transferred onto a spatial surface region of the transfer substrate. Once this bonding occurs, the transfer substrate can be handled and used as a larger effective donor substrate according to a specific embodiment. The donor substrate regions can each be oxidized 307 and then bonded to the surface region of a handle substrate, as shown. As merely an example, the oxidation layer is often formed on a silicon substrate. The oxidation layer can be a natural oxide, thermal oxide, deposited oxide, or any other type of oxide layer, which enhanced bonding the donor substrate regions on the transfer substrate. In a specific embodiment, the method performs a cleaning and/or activating process (e.g., plasma activated process) on surfaces of the donor substrate regions, which have been oxidized, and the transfer substrate according to a specific embodiment. Such plasma activating processes clean and/or activate the surfaces of the substrates. The plasma activated processes are provided using a nitrogen bearing plasma at 20° C.-40° C. temperature. The plasma activated processes are preferably carried out in dual frequency plasma activation system manufactured by Silicon Genesis Corporation of San Jose, Calif. Of course, there can be other variations, modifications, and alternatives.

Figure 4:
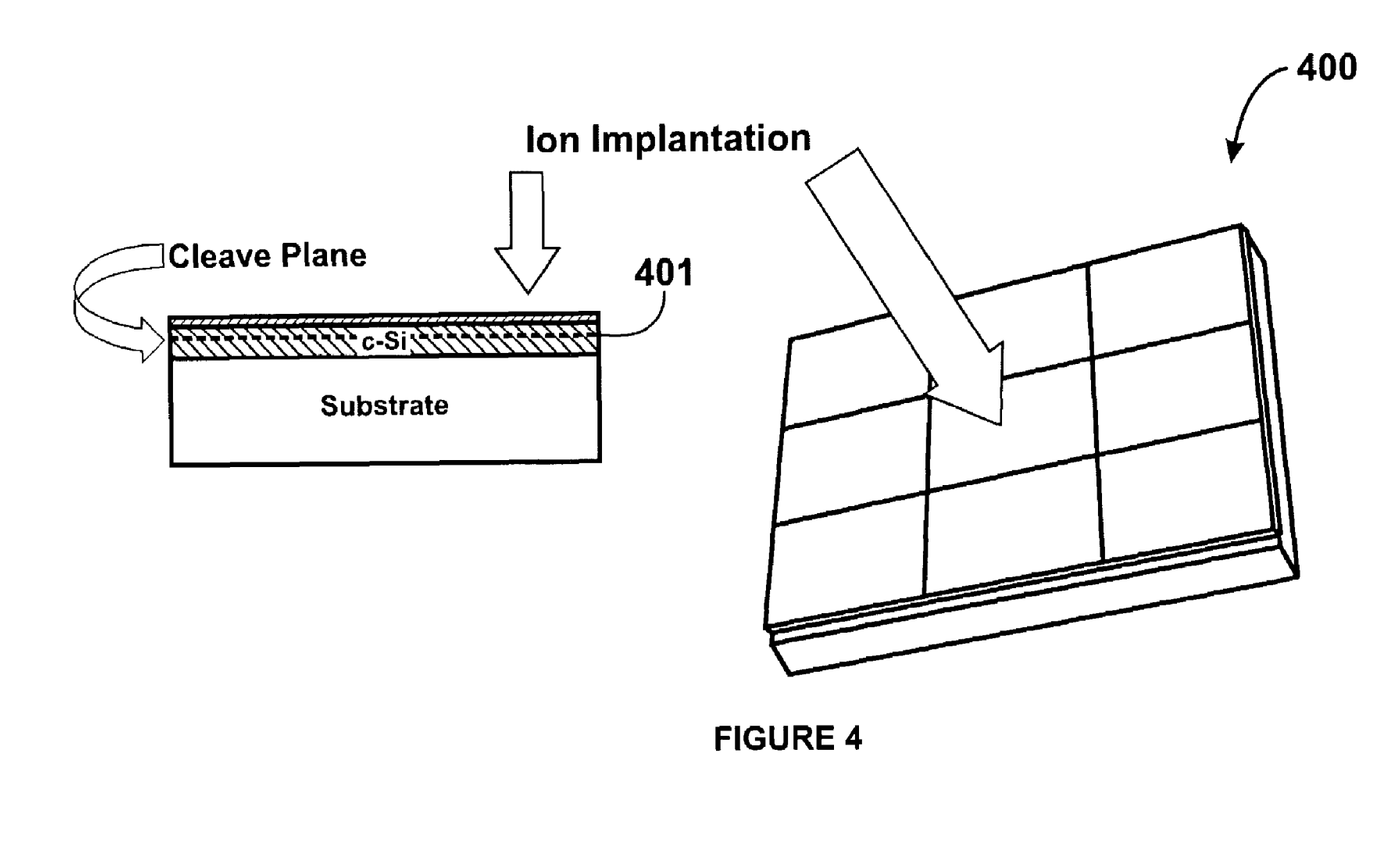

Referring now to FIG. 4, the method introduces a plurality of particles 400 concurrently through each of the donor substrate surface regions to form a cleave region 401 provided by the plurality of particles between the donor substrate thickness and the donor substrate surface region. In a preferred embodiment, the particles are implanted through surfaces of at least two or more donor substrate regions and most preferably through each of the donor substrate regions simultaneously for efficiency.

Depending upon the embodiment, the cleave region can be formed using a variety of techniques. That is, the cleave region can be formed using any suitable combination of implanted particles, deposited layers, diffused materials, patterned regions, and other techniques. Referring again to FIG. 4, the method introduces certain energetic particles using an implant process through a top surface of each of the donor substrate regions simultaneously to a selected depth, which defines a thickness of the material region, termed the "thin film" of material. A variety of techniques can be used to implant the energetic particles into the silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Such techniques can be particularly effective due to its ability to implant large areas from different substrates simultaneously according to a specific embodiment. Combination of such techniques may also be used. Ion implant dose for the non-mass specific techniques should be about 10 percent end to end uniformity across the multiple substrates or better. Ion implant depth uniformity for the non-mass specific techniques should be about 10 percent end to end uniformity across the multiple substrates or better. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about 20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Depending upon the embodiment, there may be other techniques for forming a cleave region and/or cleave layer. As merely an example, such cleave region is formed using other processes, such as those using a silicon germanium cleave plane developed by Silicon Genesis Corporation of San Jose, Calif. and processes such as the SmartCut™ process of Soitec SA of France, and the Eltran™ process of Canon Inc. of Tokyo, Japan, any like processes, and others. Of course, there may be other variations, modifications, and alternatives.

Figure 5:
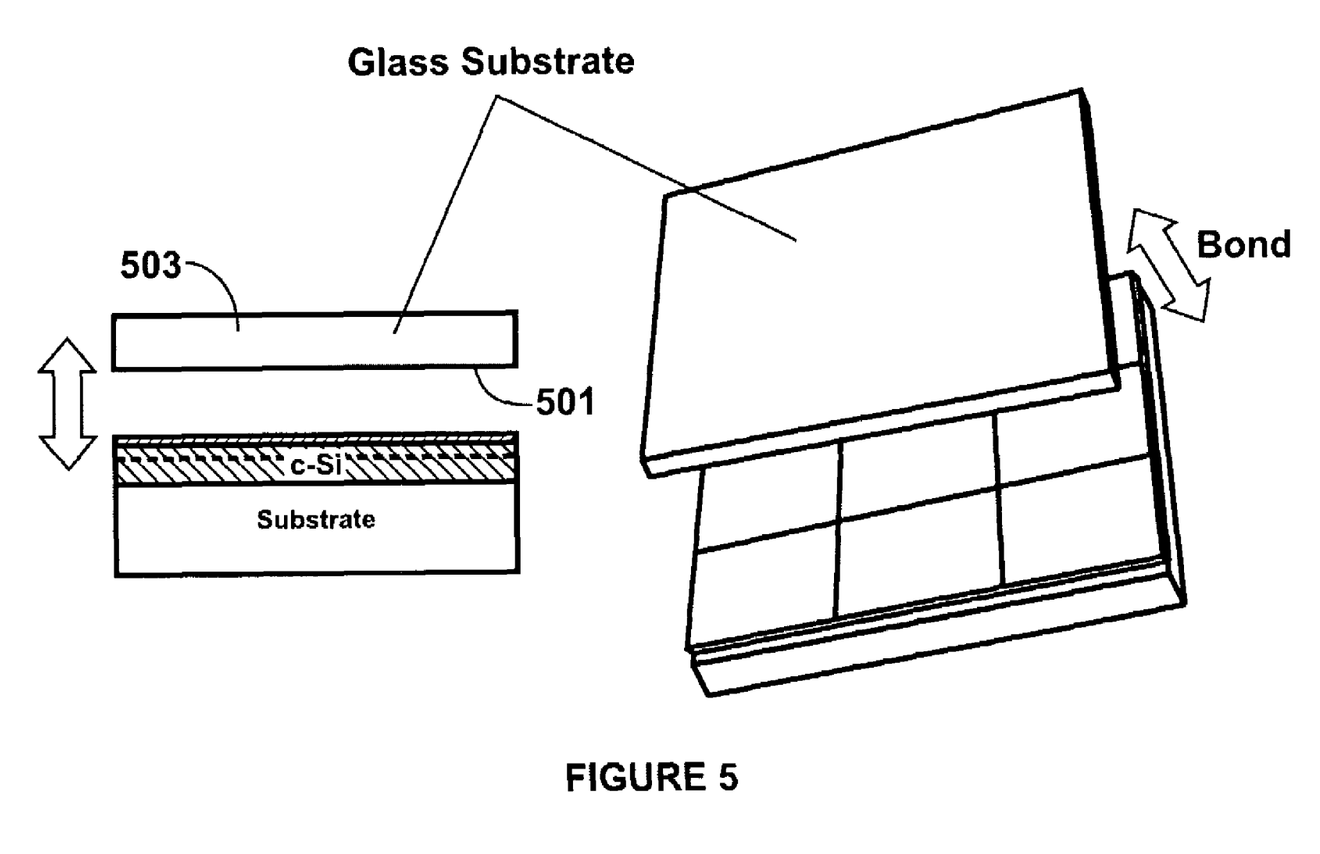

In a specific embodiment, the method includes joining each of the donor substrate surface regions to a handle substrate surface region 501 as illustrated by FIG. 5. As shown, the handle substrate surface region is provided from a handle substrate 503. Before joining, the handle substrate and donor substrate surfaces are each subjected to a cleaning solution to treat surfaces of the substrates to clean the donor substrate surface regions according to a specific embodiment. An example of a solution to clean the substrates and handle substrate can e a mixture of hydrogen peroxide and sulfuric acid and other like solutions according to a specific embodiment. A dryer can dry the donor substrates and handle substrate surfaces to remove any residual liquids, particles, and other impurities from the substrate surfaces. Self bonding occurs by placing surfaces of the cleaned substrates (e.g., donor substrate regions and handle substrate) together after an optional plasma activation process depending upon a specific layer transfer process used. If desired, such plasma activated processes clean and/or activate the surfaces of the substrates. The plasma activated processes are provided, for example, using an oxygen and/or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together according to a specific embodiment. As shown, the handle substrate has been bonded to the plurality of donor substrate surface regions. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the handle substrate and each of the donors is substantially permanent and has good reliability. For larger glass sizes, custom bonding equipment would be desired but are mostly larger versions of those used to bond together semiconductor substrates according to a specific embodiment.

Accordingly after bonding, the bonded substrate structures are subjected to a bake treatment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for silicon donor substrates and the handle substrate to attach themselves to each other permanently according to the preferred embodiment. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process or other like process. Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degrees C.) often needed to cure the SOG after it is applied to surfaces of the wafers.

Alternatively, a variety of other low temperature techniques can be used to join the donor substrate surface regions to the handle substrate. For instance, an electro-static bonding technique can be used to join the two substrates together. In particular, one or both substrate surface(s) is charged to attract to the other substrate surface. Additionally, the donor substrate surfaces can be fused to the handle wafer using a variety of other commonly known techniques. Of course, the technique used depends upon the application.

Figure 6:
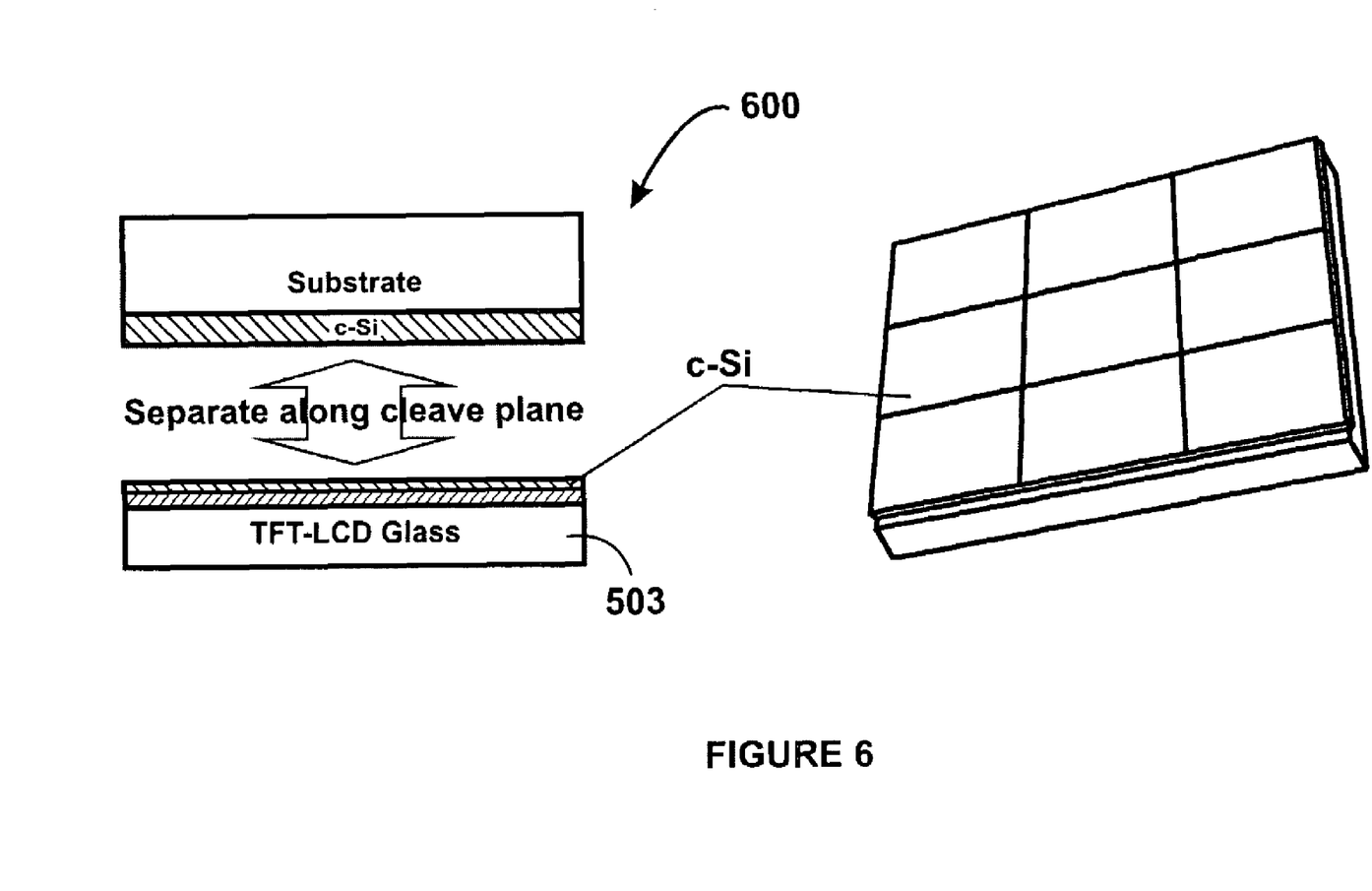

Referring to FIG. 6, the method includes a step of initiating a controlled cleaving action 600 within one or more of the donor substrates along a portion of the cleave region. Depending upon the specific embodiment, there can be certain variations. For example, the cleaving process can be a controlled cleaving process using a propagating cleave front to selectively free a thickness of material from each of the donor substrate regions attached to a handle substrate. Alternative techniques for cleaving can also be used. Such techniques, include, but are not limited to those using a silicon germanium cleave region from Silicon Genesis Corporation of San Jose, Calif., the SmartCut™ process of Soitec SA of France, and the Eltran™ process of Canon Inc. of Tokyo, Japan, any like processes, and others. The method then removes the transfer substrate, which provided each of the thickness of material from each of the donor substrate regions, from the handle substrate to form a plurality of donor substrate portions spatially disposed overlying the handle substrate surface region.

Next, the present method performs other processes on portions of the donor substrate regions, which have been attached to the handle substrate. The method forms one or more devices on one or more portions of the donor substrate portions spatially disposed overlying the handle substrate surface regions. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel display devices (e.g., LCD, AMLCD), biological and biomedical devices, and the like. Such devices can be made using deposition, etching, implantation, photo masking processes, any combination of these, and the like. Of course, there can be other variations, modifications, and alternatives. Additionally, other steps can also be formed, as desired.

Figure 7:
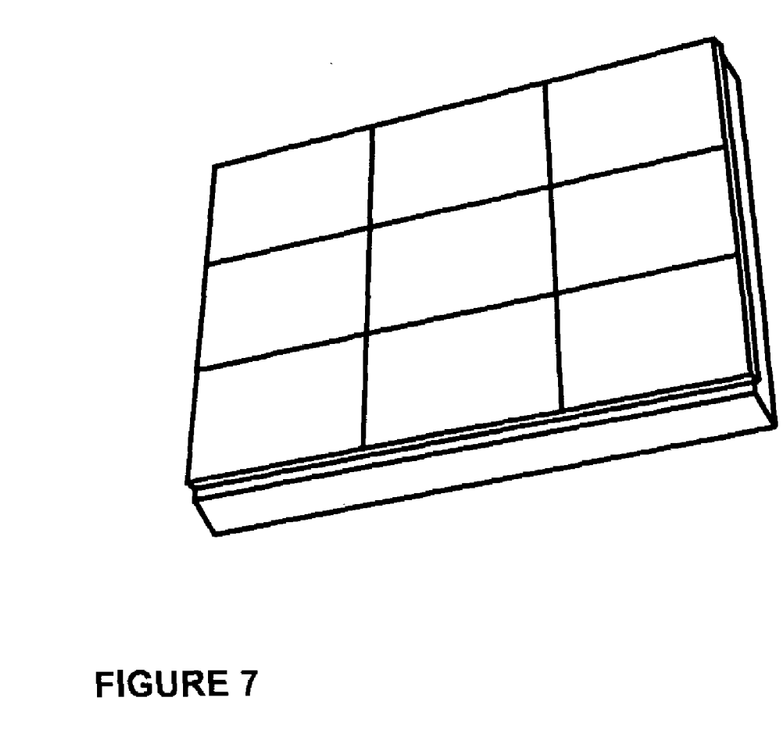

Additional processes may include a "reuse" process according to a specific embodiment, as illustrated by FIG. 7. As shown, the initial cleaving process removed a thickness of material from each of the donor substrate regions provided on the transfer substrate. The remaining donor substrate regions may be subjected to a surface smoothing process, oxidized and implanted again to form another cleave region within each of the donor substrate regions. The donor substrate regions, which now include the plurality of cleave regions, are subjected to a bonding process to another handle substrate and a cleaving process to form a tiled handle substrate including a plurality of donor substrate portions. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for forming a solar cell comprising a plurality of tile structures on a substrate member, the method comprising:
providing a transfer substrate, the transfer substrate having a surface region, the surface region supporting a plurality of separate tiled donor substrates, each of the tiled donor substrates being characterized by a tile edge, a donor substrate thickness and a donor substrate surface region having a surface area corresponding to an entire processed semiconductor substrate, each of the tiled donor substrates being spatially disposed overlying the surface region of the transfer substrate;
implanting a plurality of particles concurrently through two or more of the donor substrate surface regions supported on the transfer substrate to form a cleave region provided by the plurality of particles between a portion of the donor substrate thickness and the donor substrate surface region for the two or more tiled donor substrates; and
joining each of the donor substrate surface regions to a handle substrate surface region, the handle substrate surface region being provided from a handle substrate;
removing the transfer substrate from the handle substrate to separate along a cleave plane of the cleave region, a plurality of tiled donor substrate portions spatially disposed overlying the handle substrate surface region; and
incorporating the plurality of tiled donor substrate portions into a solar cell structure offering a sufficient photovoltaic surface area to convert solar energy into electrical power.

2. The method of claim 1 wherein the transfer substrate is composed of a single layer.

3. The method of claim 1 wherein the transfer substrate comprises a plurality of layers.

4. The method of claim 1 wherein the transfer substrate comprises a silicon bearing material.

5. The method of claim 1 wherein each of the plurality of tiled donor substrates comprises a single crystal silicon bearing material.

6. The method of claim 1 wherein the removing comprises, for each of the tiled donor substrates, cleaving the cleave region to remove a thickness of donor substrate material between the cleave region and the donor substrate surface region.

7. The method of claim 6 wherein the cleaving is characterized by a controlled cleaving action.

8. The method of claim 1 wherein the handle substrate comprises a glass substrate.

9. The method of claim 1 wherein the handle substrate comprises a quartz plate.

10. The method of claim 1 wherein the handle substrate is characterized by a first length and a first width.

11. The method of claim 1 wherein, for each of the tiled donor substrates, the cleave region comprises an implanted region and a deposited region.

12. The method of claim 1 wherein, for each of the tiled donor substrates, the cleave region comprises an implanted region, the implanted region comprising a plurality of hydrogen species.

13. The method of claim 1 wherein, for each of the tiled donor substrates, the cleave region comprises a plurality of particles therein.

14. The method of claim 1 wherein the joining comprises bonding each of the donor substrate surface regions to the handle substrate surface region.

15. A method for forming a solar cell comprising a plurality of tile structures on a substrate member, the method comprising:
provided a transfer substrate, the transfer substrate having a surface region, the surface region supporting a plurality of separate tiled donor substrates, each of the tiled donor substrates being characterized by a tile edge, a donor substrate thickness and a donor substrate surface region having a surface area corresponding to an entire processed semiconductor substrate, each of the tiled donor substrates being spatially disposed overlying the surface region of the transfer substrate;
processing the donor substrate regions provided on the transfer substrate concurrently to form a cleave region between a portion of the donor substrate thickness and the donor substrate surface region for each of the tiled donor substrates; and
joining each of the donor substrate surface regions to a handle substrate surface region, the handle substrate surface region being provided from a handle substrate;
removing the transfer substrate from the handle substrate to separate along a cleave plane of the cleave region, a plurality of tiled donor substrate portions spatially disposed overlying the handle substrate surface region; and
incorporating the plurality of tiled donor substrate portions into a solar cell structure offering a sufficient photovoltaic surface area to convert solar energy into electrical power.

16. The method of claim 15 wherein the processing comprises an implanting process.

17. The method of claim 15 wherein the processing comprises a thermal process.

18. The method of claim 15 wherein the processing causes a change in a portion of the donor substrate thickness to form the cleave region, the cleave region comprising a deposited material.

* * * * *